United States Patent [19]

Yamamoto et al.

[11] Patent Number: 4,588,918

[45] Date of Patent: May 13, 1986

[54] HOUSING AND MOUNT FOR CHIP TYPE PIEZOELECTRIC RESONATOR

[75] Inventors: Takashi Yamamoto, Hakui; Hiroyuki Takahashi; Satoshi Awata, both of Takaoka, all of Japan

[73] Assignee: Murato Mfg. Co., Ltd., Nagaokakyo, Japan

[21] Appl. No.: 729,342

[22] Filed: Apr. 30, 1985

[30] Foreign Application Priority Data

May 8, 1984 [JP] Japan ............................... 59-67491[U]

[51] Int. Cl.⁴ ............................................. H01L 41/08
[52] U.S. Cl. .................... 310/348; 310/345; 310/344
[58] Field of Search ............... 310/320, 345, 354–356, 310/348, 326, 327, 344

[56] References Cited

U.S. PATENT DOCUMENTS

| | | | |
|---|---|---|---|
| 2,341,683 | 2/1944 | Bailey | 310/356 |
| 2,395,034 | 2/1946 | Bokovoy | 310/356 |
| 3,609,417 | 9/1971 | Kaname et al. | 310/345 X |
| 4,322,652 | 3/1982 | Otsuka | 310/345 |
| 4,417,170 | 11/1983 | Benincasa | 310/345 |
| 4,485,325 | 11/1984 | Yamamoto et al. | 310/356 X |
| 4,542,315 | 9/1985 | Yamamoto et al. | 310/356 X |

FOREIGN PATENT DOCUMENTS

| | | | |
|---|---|---|---|
| 44-23196 | 10/1969 | Japan | 310/345 |
| 45-9794 | 8/1970 | Japan | 310/345 |

*Primary Examiner*—Mark O. Budd
*Attorney, Agent, or Firm*—Wenderoth, Lind & Ponack

[57] ABSTRACT

An improved chip type piezoelectric resonator in which an element having electrode layers formed on main surfaces of a piezoelectric substrate is held in a rubber-like elastic member filled in a through-bore axially formed in a chip-like case having predetermined external dimensions so as to be capable of effecting thickness shear vibration, with a consequent elimination of scattering or deviation in the external dimensions of the piezoelectric resonators.

3 Claims, 12 Drawing Figures

HOUSING AND MOUNT FOR CHIP TYPE PIEZOELECTRIC RESONATOR

BACKGROUND OF THE INVENTION

The present invention generally relates to a piezoelectric resonator and more particularly, to a chip type piezoelectric resonator which utilizes an energy trapped type thickness shear vibration mode of a piezoelectric substrate.

Figure 8:
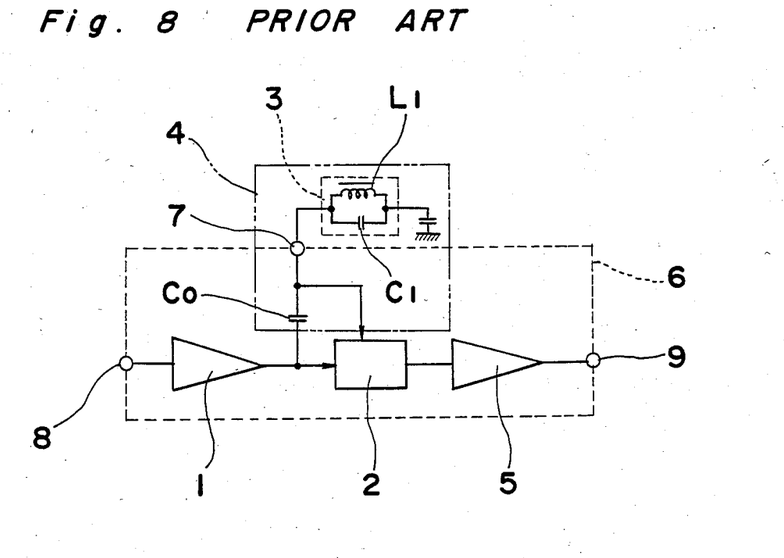
FIG. 8 is a circuit diagram representing a general quadrature detecting circuit.

Generally, as shown in FIG. 8, a quadrature detecting circuit 6 is so arranged that an output of a limiter amplifier 1 as the last stage of an FM intermediate frequency amplifier coupled therewith at a terminal 8 is applied to a phase comparator 2 as one input signal (reference signal), while a signal obtained by shifting the phase of the output signal of the limiter amplifier 1 through approximately 90° at a center frequency of the FM intermediate frequency by a phase shifter 4 constituted by a phase advancing capacitor C0 coupled at a terminal 7 to a tank circuit 3 including a coil L1 with a variable inductance and a capacitor C1 connected parallel to each other, is employed as the other input signal to said phase comparator 2 so as to be converted by said phase comparator 2, into a pulse train signal whose pulse width is varied corresponding to the amount of variation of both of the above input signals for being fed into a final stage amplifier 5, and thereafter, the pulse train signal is passed through an integration circuit (not shown), thereby to obtain its average value as an FM demodulation signal at a terminal 9. In the quadrature detecting circuit as referred to above, it has been attempted to make adjustments of the phase shifter 4 unnecessary by replacing the coil L1 and capacitor C1 in the tank circuit 3 with a two-terminal type piezoelectric resonator 11 and a damping resistance R0 for damping impedance in the vicinity of an anti-resonance frequency of said resonator 11 as in a modified tank circuit 3' in FIG. 9.

Figure 9:
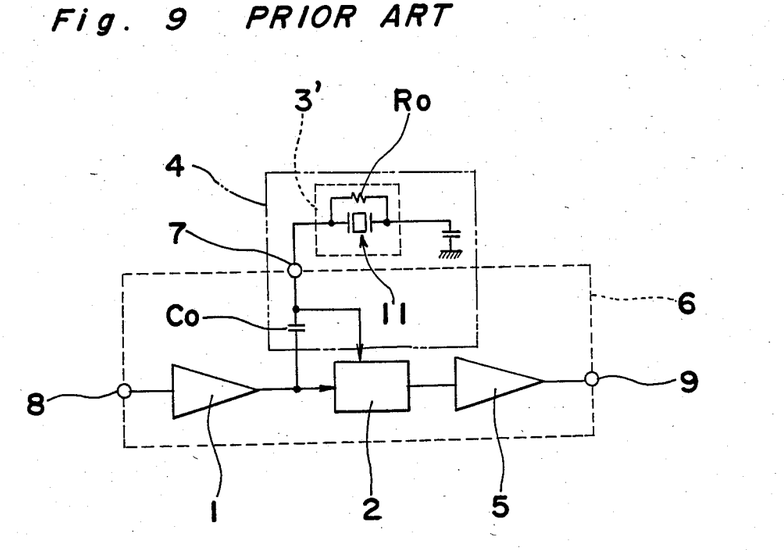
FIG. 9 is a circuit diagram of a conventional quadrature detecting circuit employing a piezoelectric resonator as an FM discriminator.
Figure 10:
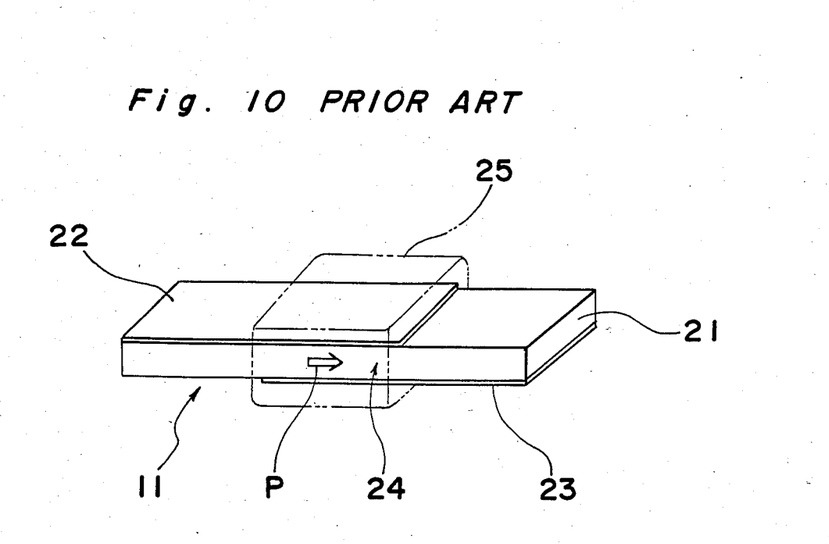
FIG. 10 is a perspective view of a conventional piezoelectric resonator employed as an FM discriminator.

Conventionally, in the quadrature detecting circuit 6 as shown in FIG. 9, there has been employed for the two-terminal type piezoelectric resonator 11, a piezoelectric resonator as shown in FIG. 10, which includes a piezoelectric substrate 21 of a high mechanical factor Qm, electrode layers 22 and 23 formed on opposite main surfaces of said substrate 21, an energy trapped type thickness shear vibration mode portion 24 of the substrate 21 held between confronting end portions of the electrode layers 22 and 23 and subjected to polarization as shown by an arrow P, and a covering layer 25 made, for example, of a resilient material such as silicone rubber, etc. and applied onto the outer periphery of said portion 24, so that the energy trapped type thickness shear vibration of the piezoelectric substrate 21 is damped by the covering layer 25 for lowering the mechanical quality factor Qm of said two-terminal type piezoelectric resonator 11, thereby to enlarge a demodulating region band width of the quadrature detecting circuit, and also, to improve output frequency characteristic and distortion factor characteristic thereof.

However, in the two-terminal type piezoelectric resonator 11 as shown in FIG. 10, although the covering layer 25 of silicone rubber and the like is formed on the outer peripheral portion of the energy trapped type thickness shear vibrating portion 24 of the substrate 21, for example, by painting, etc., it is difficult to suppress scattering or deviation in the shape of said covering layers 25 upon curing, and when the outer peripheries of the piezoelectric substrates 21 are covered by the electrically insulative resin layers, such scattering in the configuration of the covering layers 25 is noticed as it is, also in the finished products thus clad.

When the two-terminal type piezoelectric resonators 11 having the scattering in the external dimensions as described above are actually attached at a high density, on a printed circuit board as piezoelectric resonators for an FM discriminator together with other electronic parts, there has been such a problem that the two-terminal piezoelectric resonators undesirably contact other electronic parts, and thus, can not be properly mounted on the printed circuit board.

SUMMARY OF THE INVENTION

Accordingly, an essential object of the present invention is to provide an improved chip type piezoelectric resonator which is free from scattering in external dimensions, with substantial elimination of disadvantages inherent in the conventional resonators of this kind.

Another important object of the present invention is to provide a chip type piezoelectric resonator of the above described type, which is simple in construction and stable in functioning, and can be readily manufactured on a large scale at low cost.

In accomplishing these and other objects, according to one preferred embodiment of the present invention, there is provided a chip type piezoelectric resonator which includes an element having a rectangular piezoelectric substrate and electrode layers respectively formed on opposite main surfaces of the piezoelectric substrate so that a portion of said piezoelectric substrate located between said electrode layers effects an energy trapped type thickness shear vibration, and a chip-like case axially formed with a through-bore. The element is held in a rubber-like elastic member filled in the through-bore so as to be capable of performing the energy trapped type thickness shear vibration, while the electrode layers of said element are each electrically conductively connected to metallic caps respectively attached to end faces of the opening at opposite ends of the through-bore of said case.

By the arrangement according to the present invention as described above, since the element is accommodated in the chip-like case having the predetermined external dimensions, an improved chip-type piezoelectric resonator free from scattering or deviation in the external dimensions has been advantageously presented through simple construction.

BRIEF DESCRIPTION OF THE DRAWINGS

These and other objects and features of the present invention will become apparent from the following description taken in conjunction with the preferred embodiment thereof with reference to the accompanying drawings, in which.

DETAILED DESCRIPTION OF THE INVENTION

Before the description of the present invention proceeds, it is to be noted that like parts are designated by like reference numerals throughout the accompanying drawings.

Figure 1:
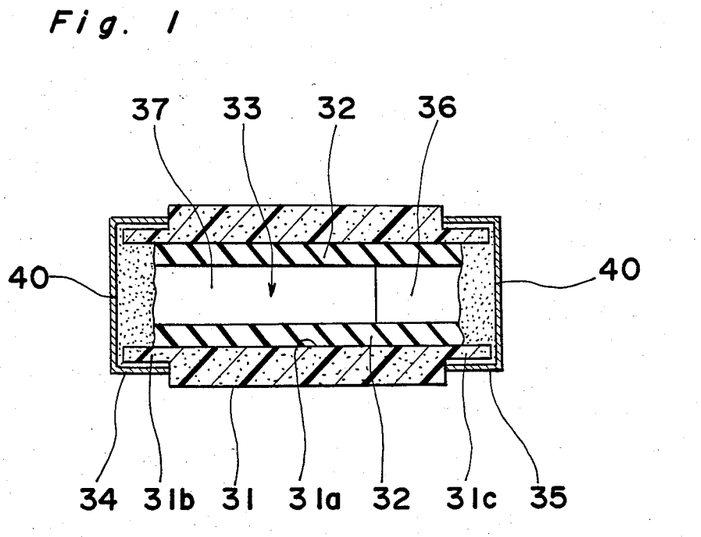
FIG. 1 is a longitudinal sectional view of a chip type piezoelectric resonator according to one preferred embodiment of the present invention.

Referring now to the drawings, there is shown in FIG. 1 a chip type piezoelectric resonator according to one preferred embodiment of the present invention, which generally includes a case 31 made of a material such as an electrically insulative resin or alumina ceramics, etc., and having a through-bore 31a axially formed therein, a rubber-like elastic member 32 of silicone rubber and the like having resiliency and filled in the through-bore 31a, and an element 33 held in said rubber-like elastic member 32 for performing energy trapped type thickness shear vibration.

Figure 2:
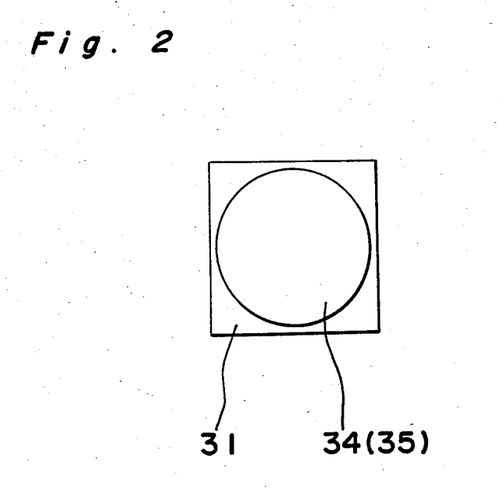
FIG. 2 is a side elevational view of the chip type piezoelectric resonator of FIG. 1.

More specifically, the case 31 referred to above has a generally square cross sectional shape, and is formed, at its opposed end portions, with cylindrical protrusions 31b and 31c over which circular metallic caps 34 and 35 are externally fitted as shown in FIG. 2.

Figure 3:
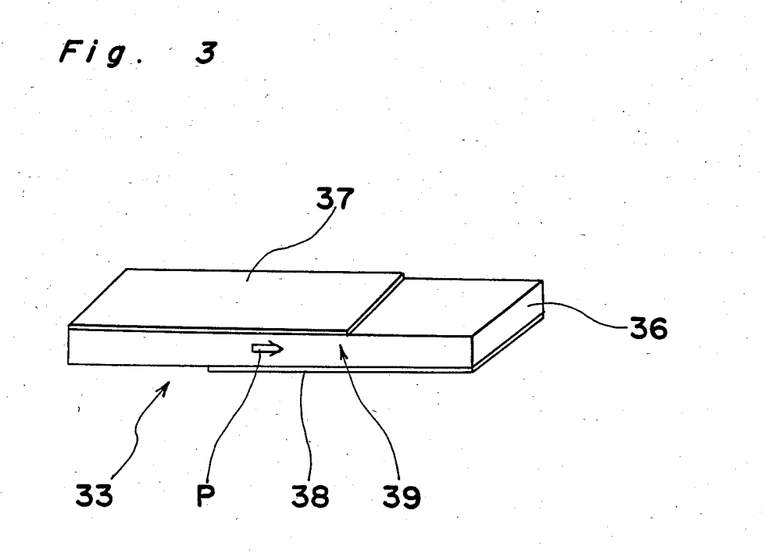
FIG. 3 is a perspective view of an element employed in the chip type piezoelectric resonator of FIG. 1.

Meanwhile, as shown in FIG. 3, the element 33 includes a rectangular piezoelectric substrate 36 and electrode layers 37 and 38 respectively formed on opposite main surfaces of the piezoelectric substrate 36 so as to confront each other at corresponding end portions thereof through a central portion 39 of the substrate 36, with other end portions of the electrode layers 37 and 38 extending alternately in directions away from each other as illustrated, while the central portion 39 of the substrate 36 for the thickness shear vibration located between the corresponding end portions of the electrode layers 37 and 38 is subjected to polarization in the longitudinal direction of the piezoelectric substrate 36 as shown by the arrow P.

The element 33 having the construction as described above is inserted in the through-bore 31a of the case 31, and is supported by the rubber-like elastic member 32 filled in said through-bore 31a in such a manner that the central portion 39 for the thickness shear vibration of the substrate 36 is supported so as to be capable of effecting the thickness shear vibration.

The electrode layer 37 of the above element 33 is conductively bonded, at the end portion of the substrate 36, to the metallic cap 34 fitted over the protrusion 31b of the case 31 by an electrically conductive bonding material 40, hile the other electrode layer 38 of said element 33 is also conductively bonded, at the other end portion of said substrate 36, to the metallic cap 35 fitted over the protrusion 31c of the case 31 by the bonding material 40.

The metallic caps 34 and 35 are also respectively bonded to the protrusions 31b and 31c of the case 31 by the bonding material 40.

In the chip type piezoelectric resonator as shown in FIG. 1, the vibration at the central portion 39 of the piezoelectric substrate 36 is damped by the rubber-like elastic member 32, with a consequent lowering of the mechanical quality factor Qm of the element 33. Moreover, since the above element 33 is accommodated in the chip-like case 31 having the predetermined dimensions, it becomes psossible to obtain the chip type piezoelectric resonator free from scattering or deviation in the external dimensions.

Subsequently, admittance characteristic and phase characteristic of the chip type piezoelectric resonator of FIG. 1 are respectively shown in diagrams of FIGS. 4(a) and 4(b), while admittance characteristic and phase characteristic in the case where the element 33 in FIG. 3 is not held in the rubber-like elastic member 32 are respectively represented by diagrams of FIGS. 5(a) and 5(b).

Figure 4A:
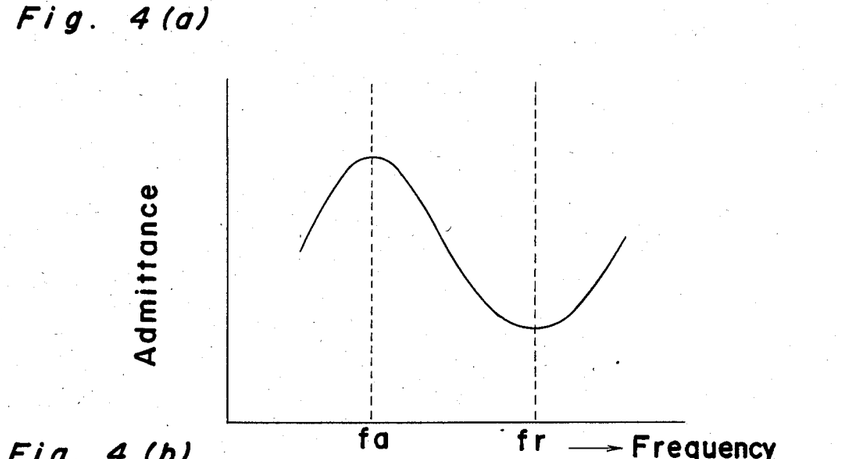
FIGS. 4(a) and 4(b) are respectively an admittance characteristic diagram and a phase characteristic diagram of the chip type piezoelectric resonator of FIG. 1.
Figure 4B:
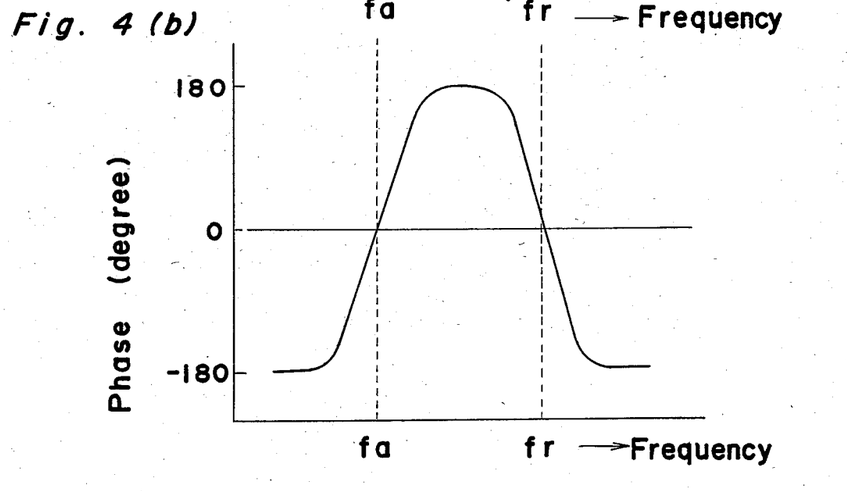
Figure 5A:
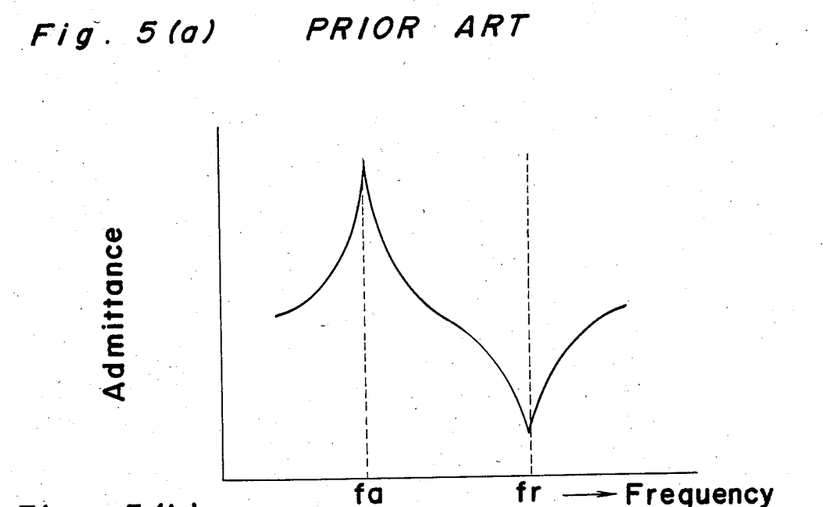
FIGS. 5(a) and 5(b) are diagrams similar to FIGS. 4(a) and 4(b), which particularly relate to the conventional piezoelectric resonator.
Figure 5B:
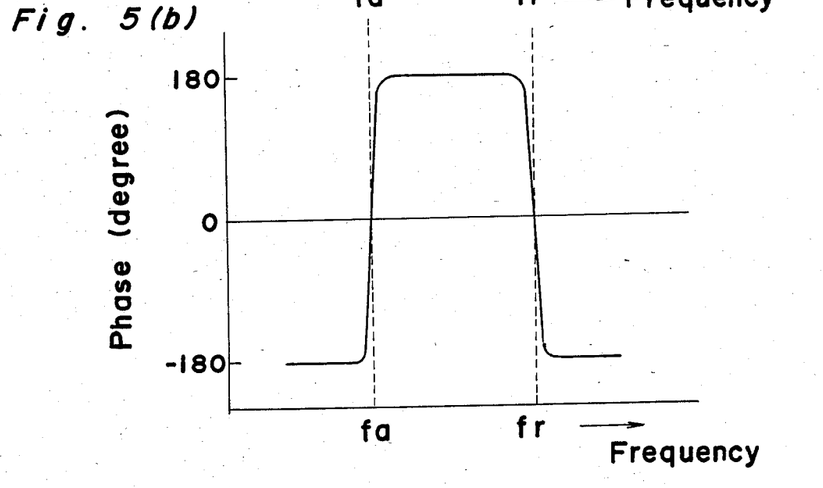

As seen upon comparison of FIGS. 4(a) and 4(b) and FIGS. 5(a) and 5(b), in the diagrams of FIGS. 4(a) and 4(b) related to the chip type piezoelectric resonator according to the present invention of FIG. 1, the admittance characteristic is rounded in the vicinity of the resonance frequency fr and anti-resonance frequency fa, while the phase characteristic shows a gentle inclination in the frequency band region including the resonance frequency fr and anti-resonance frequency fa.

Figure 6:
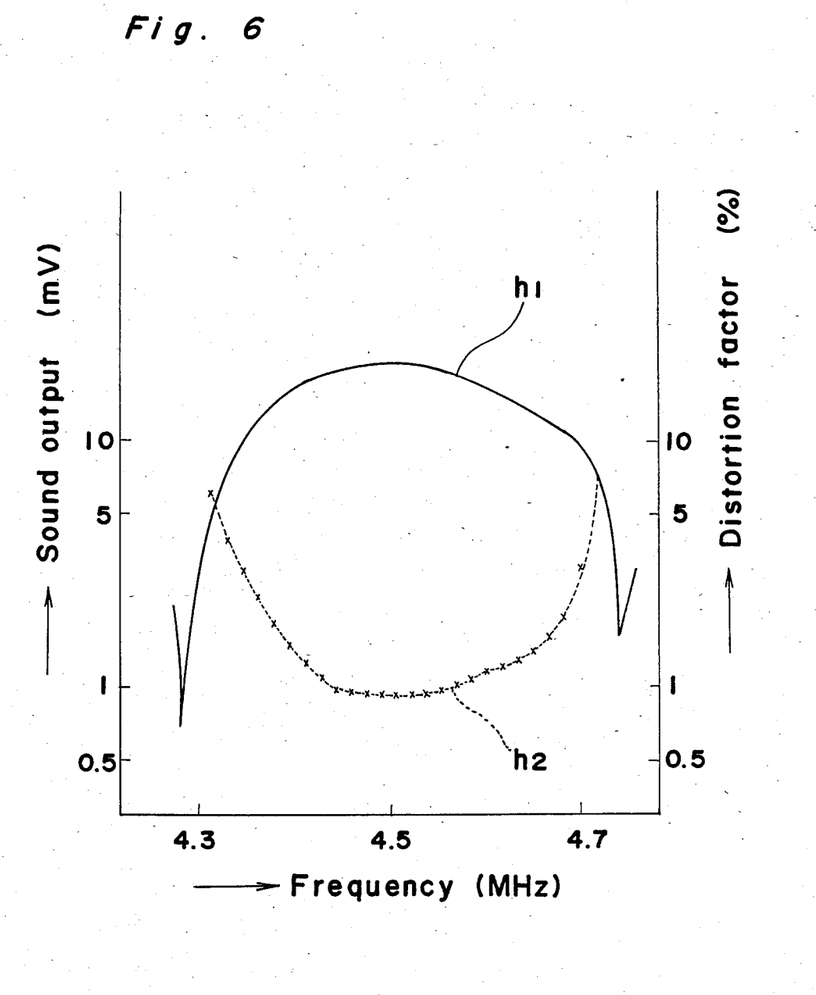
FIG. 6 is an output and distortion factor characteristic diagram in the case where the chip type piezoelectric resonator of FIG. 1 is employed as an FM discriminator of a quadrature detecting circuit.

By employing the chip type piezoelectric resonator of FIG. 1 in the quadrature detecting circuit of FIG. 9 as a piezoelectric resonator for the FM discriminator, upon measurements of the output characteristic and distortion factor characteristic thereof, results respectively represented by a solid line curve h1 and a dotted line curve h2 in FIG. 6 were obtained. Meanwhile, by using a chip type piezoelectric resonator in which the element 33 in FIG. 3 is not supported in the rubber-like elastic member 32, for the quadrature detecting circuit of FIG. 9 as a piezoelectric resonator for the FM discriminator, when the output characteristic and distortion factor characterstic thereof are measured, results respectively shown by a solid line curve h3 and a dotted line curve h4 in FIG. 7 were obtained.

Figure 7:
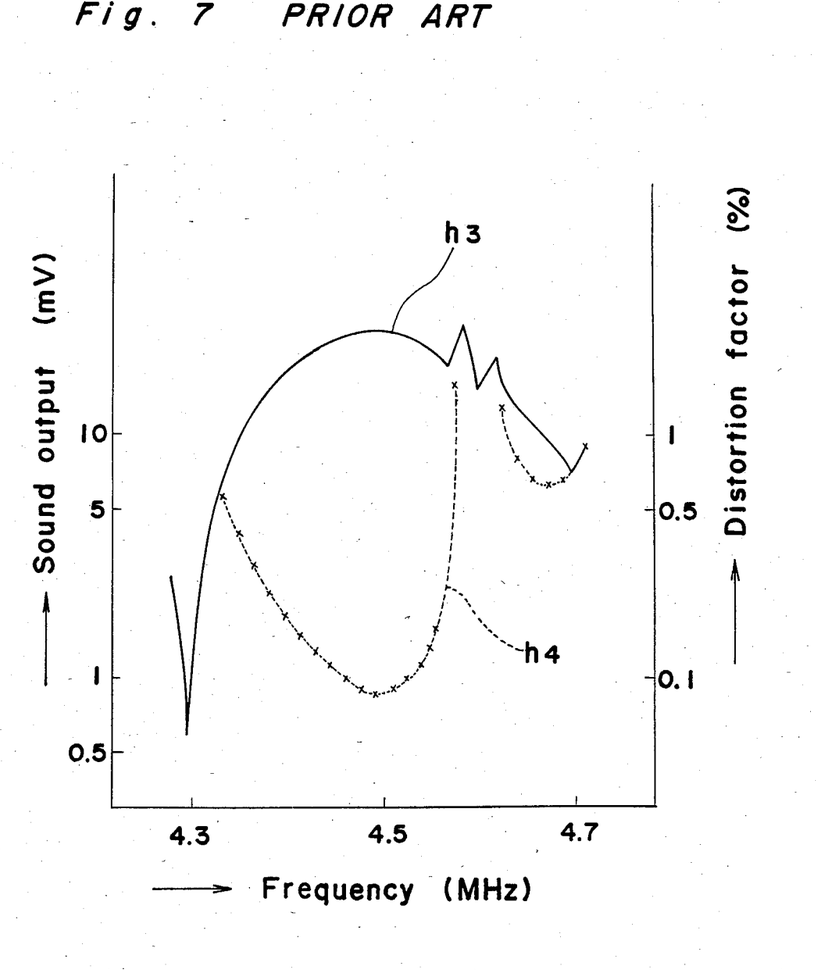
FIG. 7 is a diagram similar to FIG. 6, which is particularly related to the case where the conventional piezoelectric resonator is used as an FM discriminator of a quadrature detecting circuit.

As is seen upon comparison of the results in FIGS. 6 and 7, when the chip type piezoelectric resonator of FIG. 1 was employed as the piezoelectric resonator for the FM discriminator in the quadrature detecting circuit in FIG. 9, an FM demodulating circuit having a wide 3 dB band width may be obtained with a low distortion factor.

It should be noted here that the chip type piezoelectric resonator according to the present invention is not limited in its application to the piezoelectric resonator for the FM discriminator of the quadrature detecting circuit as described so far alone, but may widely be applied to a piezoelectric resonator for an FM discriminator of a differential peak detecting circuit or various electronic circuits requiring piezoelectric resonators having a low mechanical quality factor Qm.

As is clear from the foregoing description, according to the present invention, since it is so arranged that the element for the piezoelectric resonator is supported in the rubber-like elastic member filled within the chip-like case having the predetermined external dimensions, the element is contained in the chip-like case with the fixed external dimensions, and thus, the improved chip-like piezoelectric element free from scattering in the external dimensions may be obtained. Furthermore, owing to the construction that the element of the piezoelectric resonator is held in the rubber-like elastic member, the thickness shear vibration at the central vibrating portion of the element is damped by the rubber-like elastic member, with the lowering of the mechanical quality factor of the element, and the phase vibration becomes gentle. Thus, by employing the chip type piezoelectric resonator according to the present invention as the piezoelectric resonator for the FM discriminator, the FM demodulating circuit having a wide 3 dB band width for the output characteristics can be provided with a low distortion factor.

Although the present invention has been fully described by way of example with reference to the accompanying drawings, it is to be noted here that various changes and modifications will be apparent to those skilled in the art. Therefore, unless otherwise such changes and modifications depart from the scope of the present invention, they should be construed as included therein.

What is claimed is:

1. A chip type piezoelectric resonator which comprises an element having a rectangular piezoelectric substrate and electrode layers respectively formed on opposite main surfaces of the piezoelectric substrate so that a central portion of said piezoelectric substrate located between said electrode layers effects an energy trapped type thickness shear vibration, and a chip-like case axially formed therein with a through-bore, said element being held in a rubber-like elastic member filled in said through-bore so as to be capable of performing the energy trapped type thickness shear vibration, said electrode layers of said element being each electrically conductively connected to metallic caps respectively attached to end faces of the opening at opposite ends of the through-bore of said case.

2. A chip type piezoelectric resonator as claimed in claim 1, wherein said electrode layers respectively formed on the opposite main surfaces of said piezoelectric substrate are arranged to confront each other at corresponding end portions thereof through the central portion of said substrate, with other end portions of said electrode layers extending alternately in directions away from each other, with said central portion of the substrate for the thickness shear vibration located between the corresponding end portions of the electrode layers being subjected to polarization in the longitudinal direction of the piezoelectric substrate.

3. A chip type piezoelectric resonator as claimed in claim 1, wherein the end faces of the opening at the opposite ends of the through-bore of said case are formed with cylindrical protrusions over which said metallic caps having a circular cross section are fitted, with said electrode layers being respectively bonded to said metallic caps by an electrically conductive bonding material.

* * * * *